United States Patent
Iyengar

(10) Patent No.: US 7,441,171 B2
(45) Date of Patent: Oct. 21, 2008

(54) EFFICIENT SCAN CHAIN INSERTION USING BROADCAST SCAN FOR REDUCED BIT COLLISIONS

(75) Inventor: Vikram Iyengar, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 386 days.

(21) Appl. No.: 11/277,375

(22) Filed: Mar. 24, 2006

(65) Prior Publication Data

US 2007/0226564 A1    Sep. 27, 2007

(51) Int. Cl.
*G01R 31/28* (2006.01)
(52) U.S. Cl. .................. 714/729; 714/727; 714/726
(58) Field of Classification Search .......... 716/2, 716/3, 18; 714/738, 726, 729, 727
See application file for complete search history.

(56) References Cited

U.S. PATENT DOCUMENTS

| | | | |
|---|---|---|---|
| 5,828,579 A * | 10/1998 | Beausang | 716/2 |
| 5,949,692 A * | 9/1999 | Beausang et al. | 716/18 |
| 6,886,124 B2 * | 4/2005 | Wang | 714/738 |
| 6,948,106 B2 | 9/2005 | Porterfield | |
| 6,986,090 B2 * | 1/2006 | Hathaway et al. | 714/727 |
| 7,155,687 B2 * | 12/2006 | Cheung et al. | 716/3 |
| 7,231,570 B2 * | 6/2007 | Wang et al. | 714/729 |
| 7,249,298 B2 * | 7/2007 | Sim | 714/726 |

* cited by examiner

*Primary Examiner*—David Ton
(74) *Attorney, Agent, or Firm*—Gibb & Rahman, LLC; Richard M. Kotulak, Esq.

(57) ABSTRACT

Disclosed is a method of inserting scan elements onto scan chains of broadcast scan structures to minimize the number of collisions in a plurality of logic cones. Each logic cone is selected and evaluated to identify all of the scan elements that provide inputs thereto. The identified scan elements are systematically inserted into the scan chains in the broadcast scan structure in a manner that minimizes insertion of multiple scan elements into the same sequential position on different scan chains that receive a test pattern from the same scan-in pin. If possible, the elements are inserted into the same scan chain or into scan chains that fan out from different pins. Optionally, if multiple elements are inserted at the same sequential position in scan chains that fan out from the same pin, these multiple elements can be marked so that they will not be used for test generation, thereby, completely eliminating bit collisions 20 Claims, 7 Drawing Sheets

EFFICIENT SCAN CHAIN INSERTION USING BROADCAST SCAN FOR REDUCED BIT COLLISIONS

BACKGROUND

1. Field of the Invention

The invention generally relates to broadcast scan, and, more particularly, to a method for efficiently inserting scan elements into scan chains to reduce or eliminate bit collisions.

2. Description of the Related Art

Scan testing of circuits is accomplished by connecting scan elements (i.e., latches or flip-flops) in series in a test path so that the output of each scan element is fed to the input of the next scan element in the scan chain. Each test pattern is shifted in to the scan chain via a scan-in pin. Then, the test pattern from the scan element in the scan chain is shifted in to a cone of logic (i.e., a combination logic in a circuit that resolves to a single point) under test. In a broadcast scan technique, each scan-in pin is fanned out to multiple scan chains. That is, each test pattern that is scanned into the chip via a single scan-in pin passes through multiple scan chains. Thus, the same values (e.g., 0 or 1) appear at the inputs of the set of scan chains that receive their data from the same scan-in pin. This technique has been shown to reduce test data volume and test time. However, using this technique may cause test coverage to suffer.

Specifically, when using the broadcast scan technique, the input received by each scan element (i.e., latch or flip-flop) at the same sequential position on different scan chains that receive a test pattern from the same scan-in pin will necessarily have the same value. Collisions can occur if the values required to be scanned-in to test a certain cone of logic must be different. That is, if the logic-under-test requires opposite values on two scan elements that are at the same sequential position on two parallel scan chains that fan out from the same scan-in pin, there will be a collision. This collision may make it harder to generate tests for a fault and may cause the test coverage to suffer.

Several solutions for the problem are known. For example, after test patterns have been applied using the broadcast scan technique, clean-up patterns using full scan (p=1) can be applied to test untested faults. However, these clean-up patterns increase test data volume and test time, thereby, defeating the purpose of using the broadcast scan technique. Alternatively, scan chains can be inserted such that all the scan elements in a certain core or module appear on the same scan chain in the hope that a section of logic will be able to receive opposite values on different input scan elements. However, even if all inputs of a core are on the same scan chain, this ad hoc method cannot be proven to minimize collisions of scan elements, since it is an optimistic guess at best and ensuring that all internal elements of a core lie on the same short scan chain is impossible.

Therefore, there is a need in the art for an improved broadcast scan technique that maximizes test coverage and, more particularly, for a method of efficiently inserting scan elements (i.e., latches or flip-flops) into scan chains to reduce or completely eliminate bit collisions.

SUMMARY

In view of the foregoing, disclosed herein are embodiments of a method for efficiently and systematically inserting scan elements (i.e., latches or flip-flops) into scan chains of broadcast scan structures in order to reduce or completely eliminate bit collisions and, thereby, maximize test coverage.

Embodiments of the method of the invention start with a conventional broadcast scan structure that comprises a plurality of scan-in pins. Each of the scan-in pins is connected to a corresponding plurality of scan chains and is adapted to insert a test pattern into those corresponding scan chains. Each of the scan chains will comprise a plurality of scan elements (i.e., latches or flip-flops) connected in series with the output of one scan element feeding the input of another. The totality of scan-in pins, scan chains and scan elements reside within a single circuit. The single circuit comprises a plurality of cones of logic (i.e., combinations of logic), each of which receives input from multiple scan elements (i.e., latches or flip-flops) and each of which resolves to a single scan element (i.e., a single latch or flip-flop). It should be noted that any single scan element in the circuit may provide input to one or more of the different cones of logic.

Then, a first cone of logic within the circuit is selected and evaluated. Specifically, the selected first cone of logic is evaluated to identify all of the scan elements (i.e., latches or flip-flops) that provide inputs to the cone of logic and the identified scan elements are then systematically inserted into positions on the various scan chains in the broadcast scan structure. Specifically, the identified scan elements are inserted into the scan chains in a manner that minimizes the insertion of multiple scan elements into the same sequential position on different scan chains that receive the test pattern from the same scan-in pin (i.e., into the same position on different scan chains that fan out from the same scan-in pin). In order to minimize the insertion of multiple scan elements in this manner, the identified scan elements are systematically inserted into the same scan chain or into scan chains that fan out from different scan-in pins.

More specifically, the first position of the first scan chain that receives the test pattern from the first scan-in pin is selected. A determination is made as to whether or not this first position is empty. If the first position is empty, then a determination is made as to whether or not any of the identified scan elements are already assigned to any of the other first positions in any of the other scan chains that receive the test pattern from that same first scan-in pin. If none of the other identified scan elements are so assigned, then one of the identified scan elements (i.e., latches or flip-flops) that has not already been inserted into the broadcast scan chain structure is inserted into this first position. If the first position is not empty, if other first positions are already so assigned, or once one of the identified scan elements is inserted, then the next position on this scan chain is selected and evaluated. The process is repeated sequentially through all positions in all scan chains corresponding to all scan-in pins until no empty position is available that does not already have at least one the identified scan elements at the same sequential position in a scan chain that fans out from the same scan-in pin. For example, as long as there are still scan elements that require insertion, each position in the scan chain is evaluated in sequence. Once a scan chain is completely evaluated, then the first position of the next scan chain that fans out from the first scan-in pin is evaluated, and so on. Once all of the positions in all of the scan chains that fan out from the first scan-in pin are evaluated, then the first position of the first scan chain that fans out from the second scan-in pin is evaluated and so on.

If any of the identified scan elements (i.e., latches or flip-flops) remain (i.e., still require insertion) after all positions in all scan chains fanning out from all scan-in pins have been evaluated, then any of the remaining identified scan elements are inserted in the same systematic manner, described above, so that no more than two of the scan elements are positioned at the same sequential position in different scan chains that receive the test pattern from the same scan-in pin. By identifying the scan elements (i.e., latches or flip-flops) that are inputs to the cone of logic that is selected for testing and systematically inserting the scan elements into the scan chains in the manner described above, the likelihood of collisions is minimized and test coverage is optimized.

Once all the scan elements (i.e., latches or flip-flops) from the selected first cone of logic have been inserted into the scan chains of the broadcast scan structure, a second cone of logic within the circuit is selected. The process of selection of cones of logic for the purpose of inserting the scan elements (i.e., latches or flip-flops) from the selected cones of logic into the scan chains of the broadcast scan structure continues until all the cones of logic within the circuit have been selected. It should be noted that scan elements that provide input to multiple cones of logic are inserted only one time. Thus, it should also be noted that as each cone of logic is considered in series, the determination that is made at process 312 includes an evaluation as to whether any of the scan elements that provided input to the cone of logic currently under consideration also provided input to an earlier considered cone of logic, such that they have already been assigned to a position in one of the scan chains.

Optionally, once the technique, described above, of inserting the identified scan elements into various scan chains is completed, if multiple scan elements (i.e., more than one latch or flip-flop) are inserted at the same sequential position in scan chains that fan out from the same scan-in pin, these multiple scan elements can be marked (e.g., with an X) so that they will not be used for test generation. By preventing these multiple scan elements from being used for test generation, collisions can be completely eliminated.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
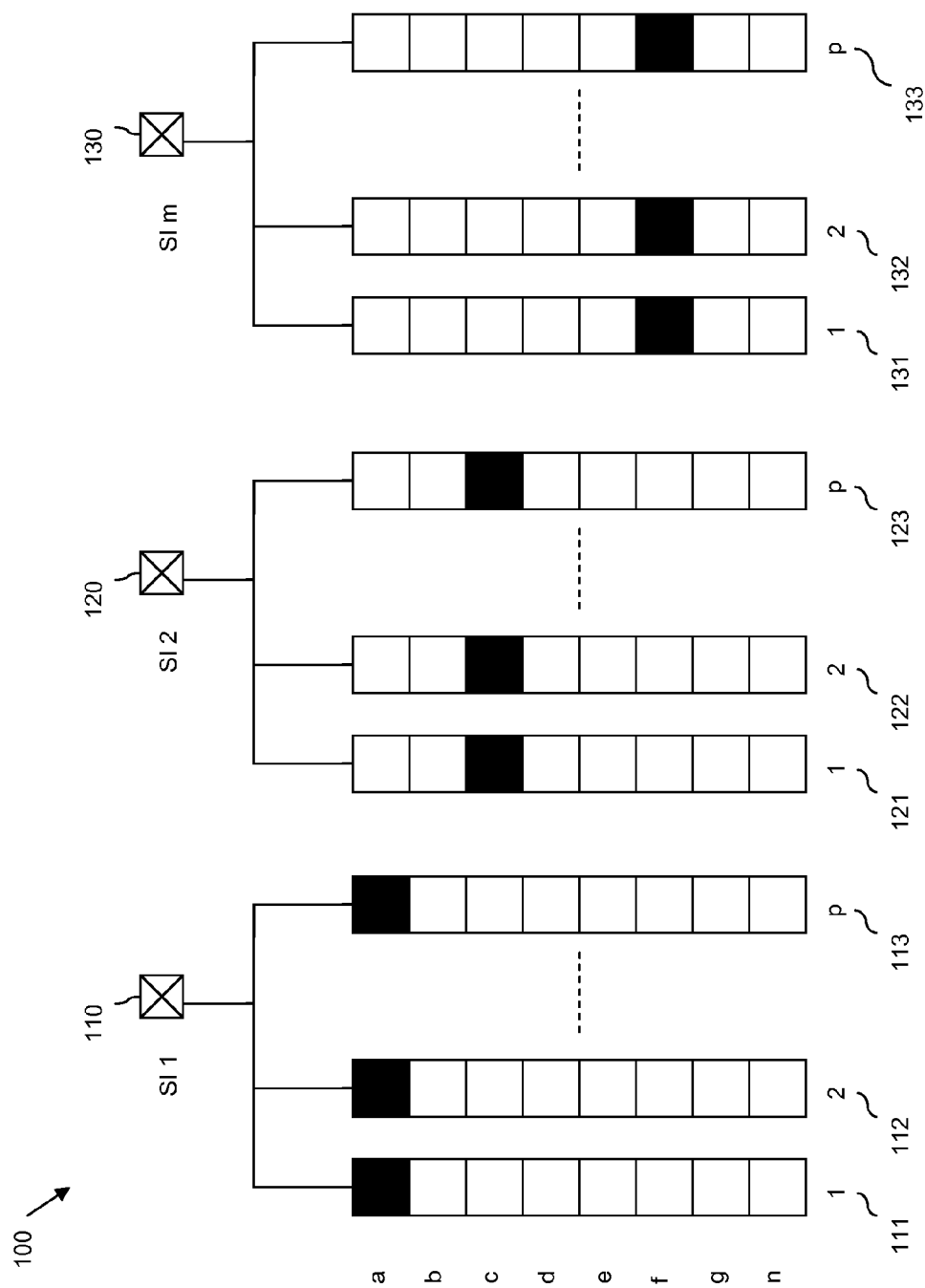
FIG. 1 is a schematic diagram illustrating a broadcast scan structure.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, scan testing of circuits is accomplished by connecting scan elements (i.e., latches or flip-flops) in series in a test path (i.e., a scan chain) so that the output of each scan element is fed to the input of another scan element in the scan chain. Test patterns (i.e., test data) are applied to a scan chain via a scan-in pin. Then, the test pattern from the scan chain is applied to a cone of logic (i.e., a combination of logic in a circuit that resolves to a single point) under test.

Referring to FIG. 1, in an exemplary broadcast scan structure 100, each scan-in pin 110, 120, and 130 is fanned out to multiple scan chains 111-113, 121-123, and 131-133, respectively. That is, each test pattern that is scanned into a chip via a single scan-in pin 110, 120 or 130 passes through multiple scan chains 111-113, 121-123, or 131-133, respectively. Thus, the same values (e.g., 0 or 1) appear at the inputs of the set of scan chains (e.g., 111-113) that receive their data from the same scan-in pin (e.g. 110). This technique has been shown to reduce test data volume and test time. However, using this technique may make it harder to generate tests for some faults and may cause test coverage to suffer.

Figure 2:
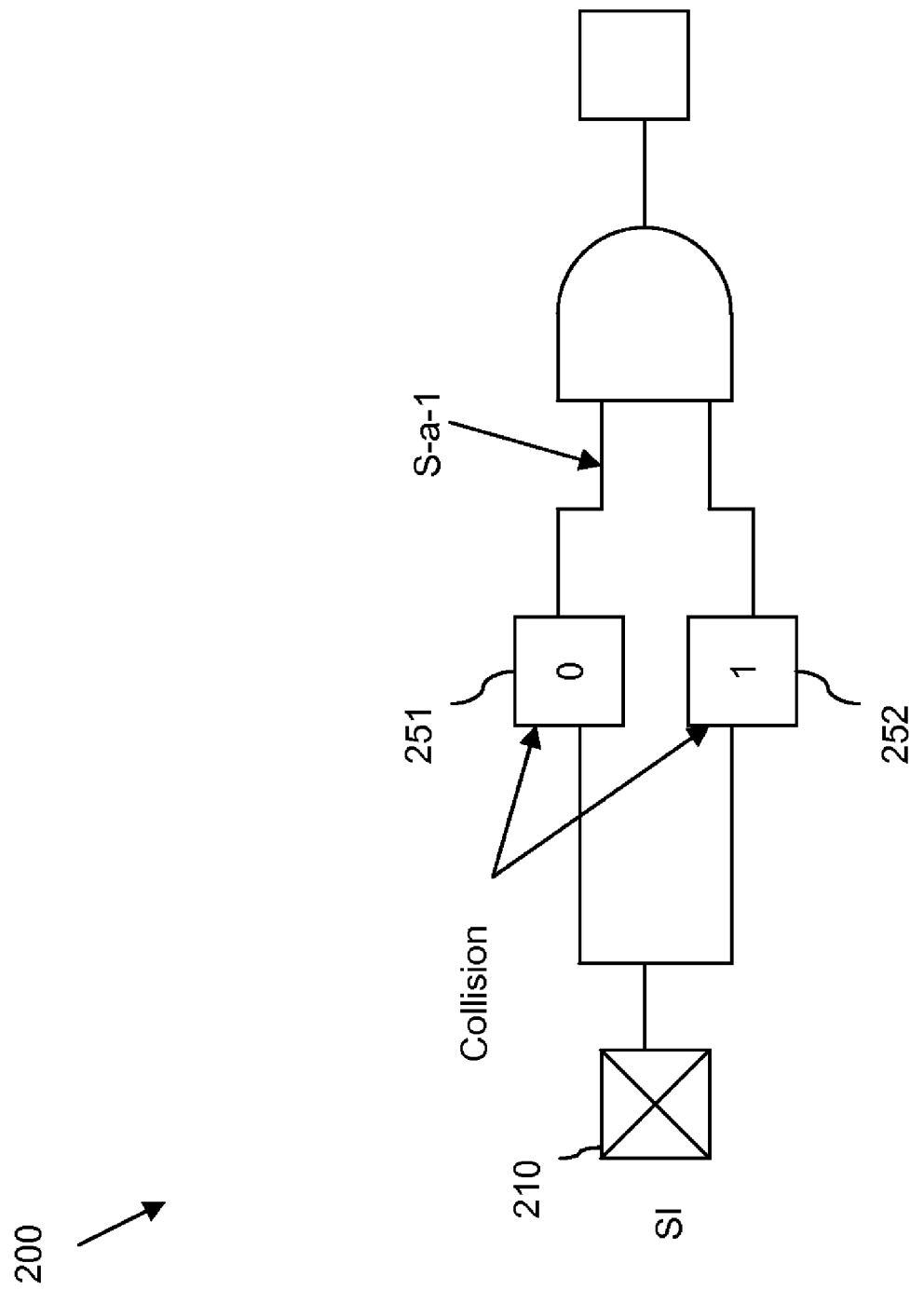
FIG. 2 is a schematic diagram illustrating an exemplary collision.

More particularly, when using the broadcast scan structure 100, the input received by each scan element (i.e., latch or flip-flops) at the same sequential position on different scan chains that receive a test pattern from the same scan-in pin (e.g., positions 111*a*, 112*a* and 113*a* on scan chains 111, 112 and 113 that receive input from pin 110), will necessarily have the same value. Referring to FIG. 2, bit collisions can occur if the values required to be scanned-in to different scan elements (e.g., latches 251, 252) to test a certain cone of logic 200 must be different (e.g., 0 and 1). That is, if the logic-under-test 200 requires opposite values (e.g., 0 and 1) on two scan elements 251 and 252 that are at the same sequential position on two parallel scan chains that fan out from the same scan-in pin, there will be a bit collision. This bit collision may make it harder to generate tests for faults and may cause the test coverage to suffer.

In view of the foregoing, disclosed herein is a heuristic method of inserting scan elements onto scan chains of broadcast scan structures so as to minimize or completely eliminate the number of bit collisions seen in a cone of logic and, thereby, solve the problem described above in order to maximize test coverage. For example, the method minimizes collisions by inserting scan elements that are inputs to a specified cone of logic into the same scan chain or into scan chains that fan out from different scan-in pins.

Figure 3:
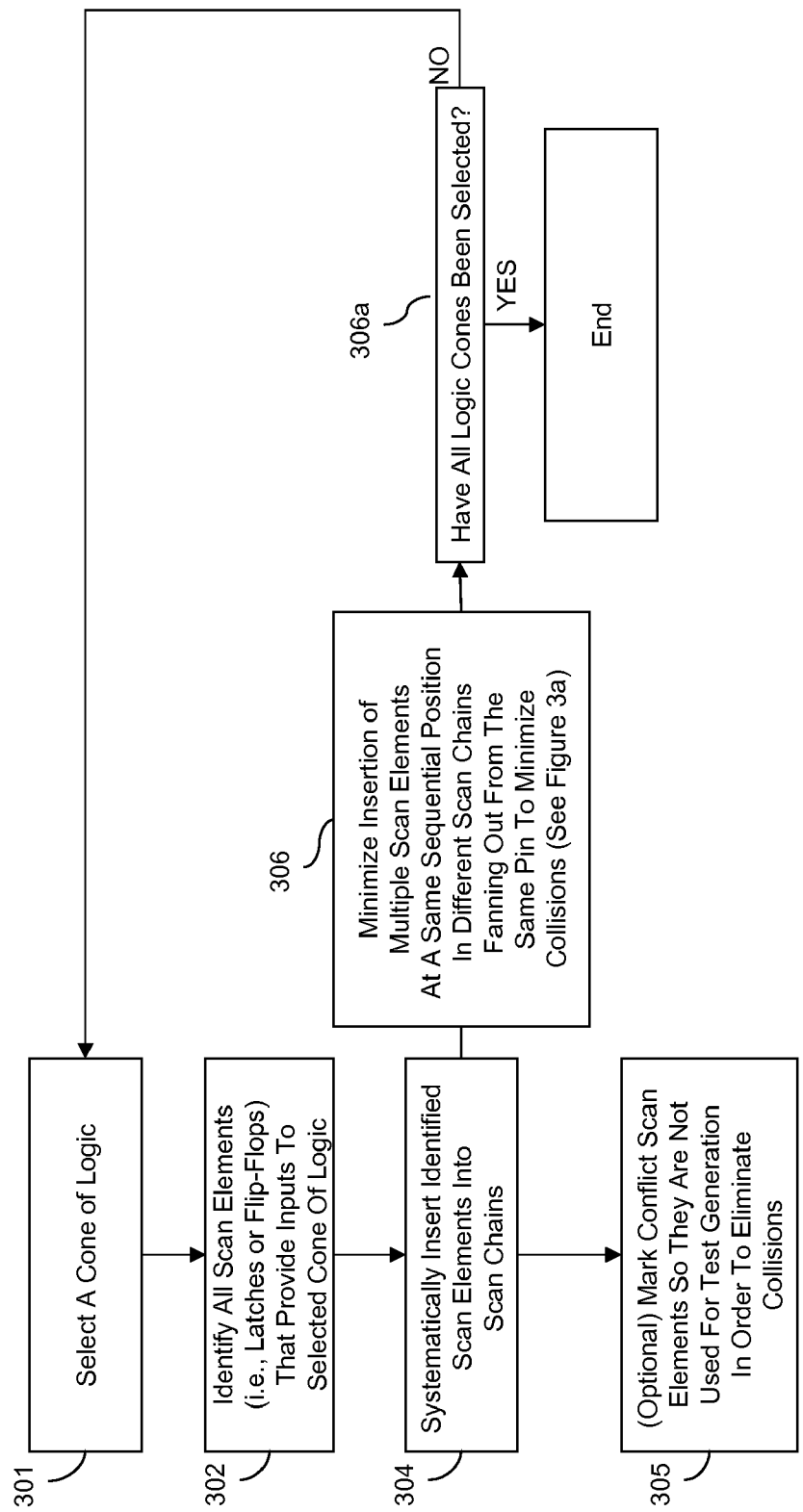
FIGS. 3 and 3*a* depict a flow diagram illustrating an embodiment of a method of the invention.

Referring to FIG. 3, embodiments of the method of the invention start with a conventional broadcast scan structure (as illustrated in FIG. 1) that comprises a plurality of scan-in pins. Each of the scan-in pins is connected to a corresponding plurality of scan chains and is adapted to insert a test pattern into those corresponding scan chains. Each of the scan chains comprises a plurality of scan elements (e.g., latches or flip-flops) connected in series with the output of one scan element feeding the input of another.

The totality of scan-in pins, scan chains and scan elements reside within a single circuit. The single circuit comprises a plurality of cones of logic (i.e., combinations of logic), each of which receives input from multiple scan elements (i.e., latches or flip-flops) and each of which resolves to a single scan element (i.e., a single latch or flip-flop). It should be noted that any single scan element in the circuit may provide input to one or more of the different cones of logic.

Figure 4:
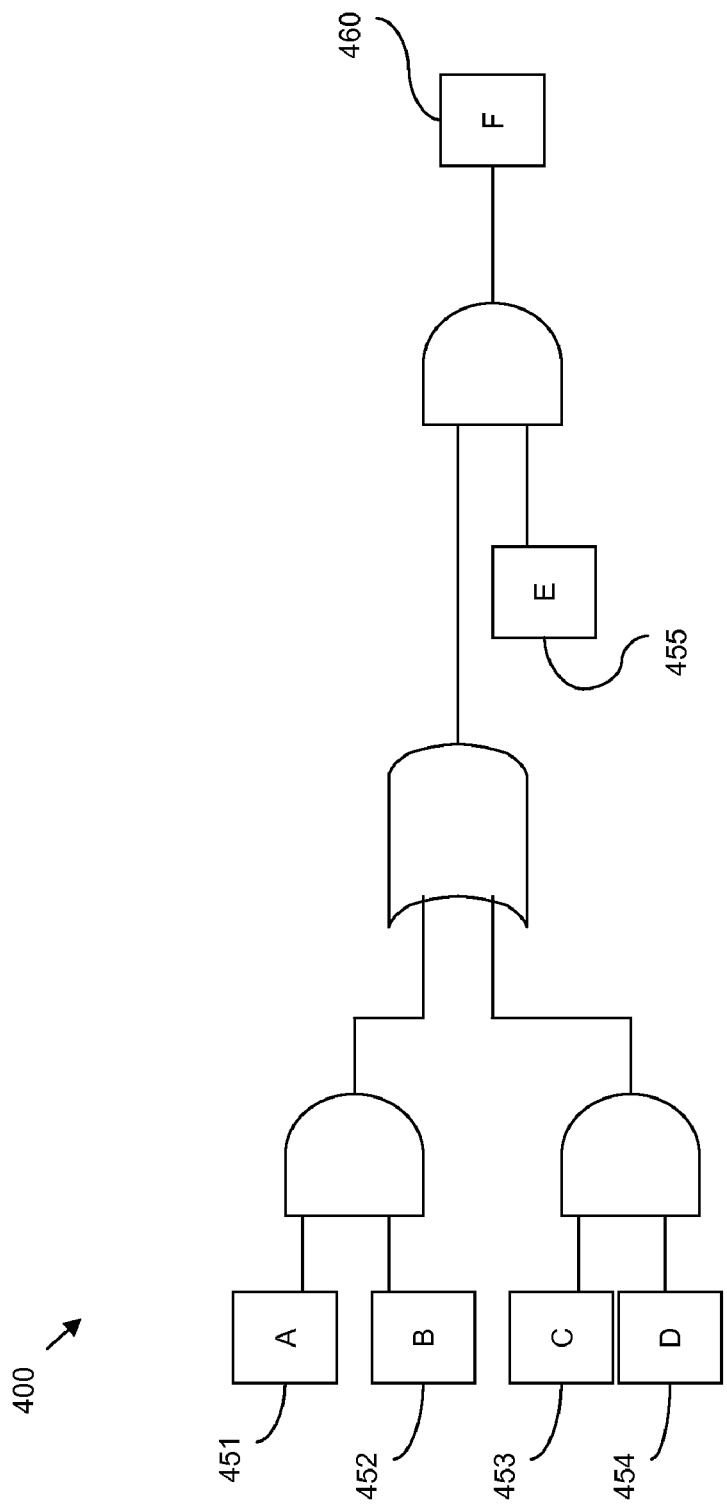
FIG. 4 is a schematic diagram illustrating an exemplary cone of logic.

Then, a first cone of logic within the circuit is selected ((301), see exemplary cone of logic 400 of FIG. 4). The selected first cone of logic 400 is evaluated to identify all of the scan elements 451-455 that provide inputs to the cone of logic 400 (302). The identified scan elements 451-455 (i.e., latches or flip-flops) are then systematically inserted into positions on the various scan chains in the broadcast scan structure in a manner that minimizes the insertion of multiple scan elements into the same sequential position on different scan chains that receive the test pattern from the same scan-in pin (304-306).

Figure 3A:
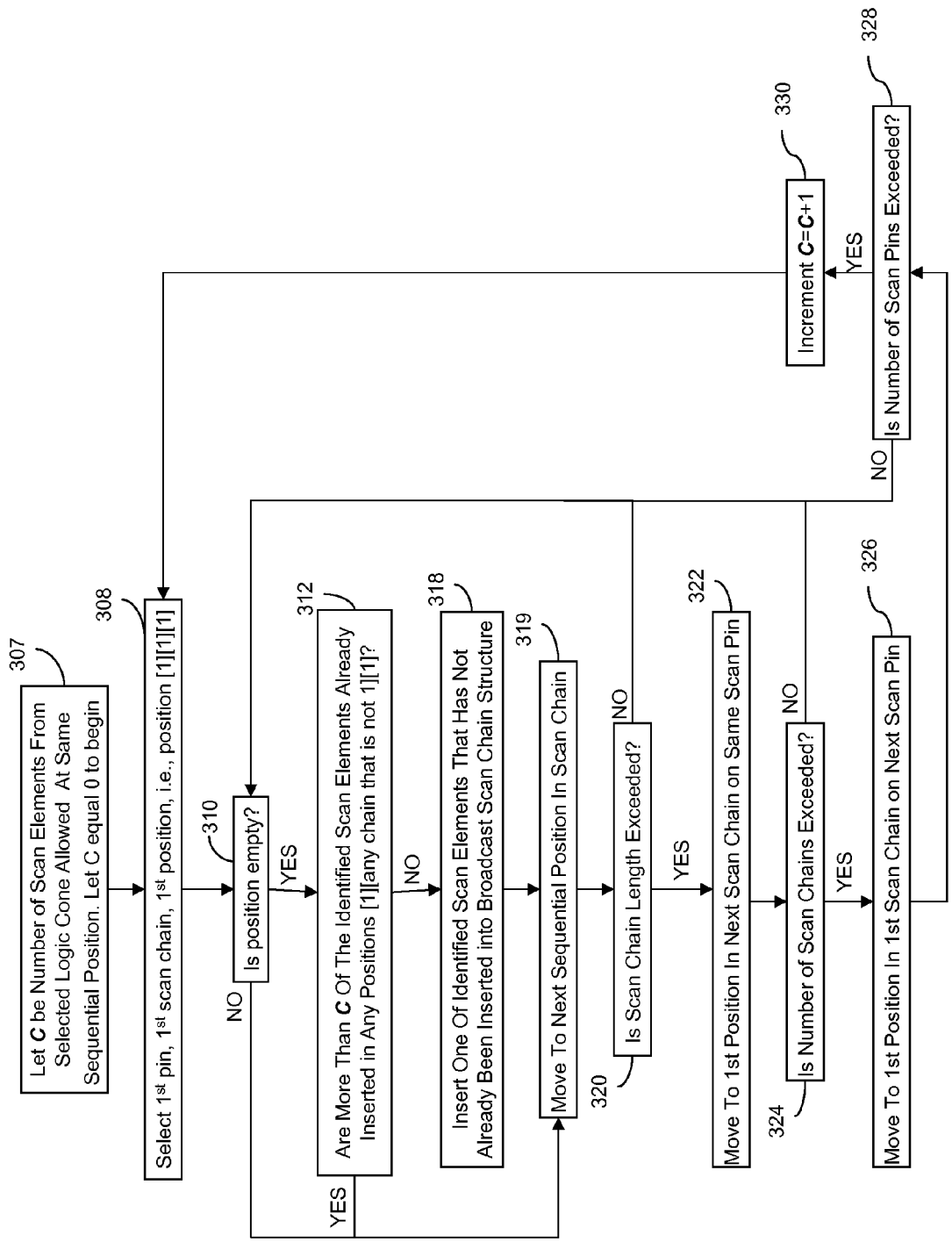
Figure 5:
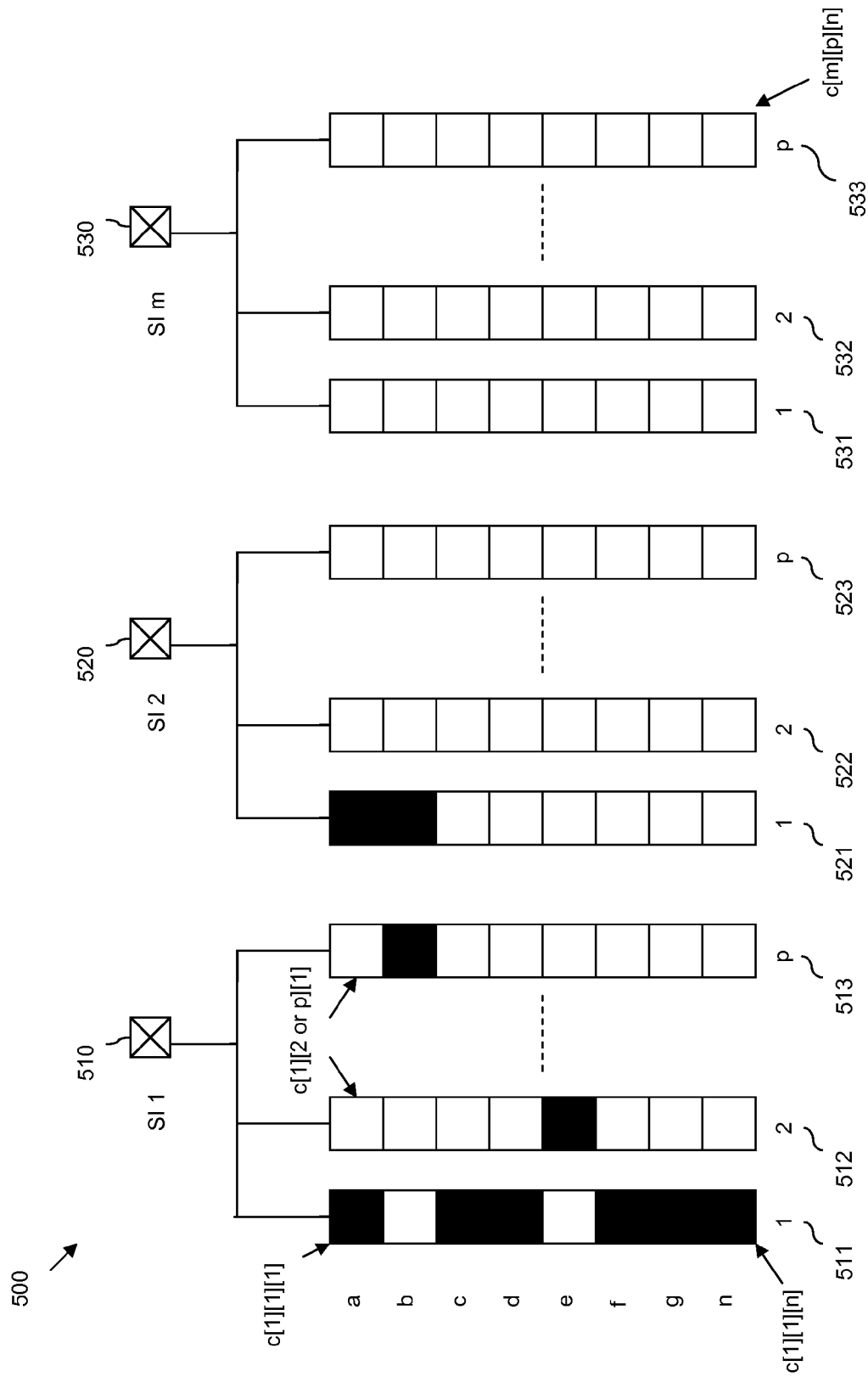
FIG. 5 is a schematic diagram illustrating processes 308-330 of the method of FIG. 3*a* implemented in an exemplary broadcast scan structure.

Referring to FIG. 5 in combination with FIG. 3a, in order to minimize the insertion of multiple scan elements (i.e., latches or flip-flops) into the same sequential position (e.g., positions 511a, 512a and 513a of broadcast scan structure 500) on different scan chains (e.g., 511, 512, 513) that receive the test pattern from the same scan-in pin (e.g., 510), the identified scan elements are systematically inserted into the same scan chain or into scan chains that fan out from different scan-in pins. Symbol C represents the number of identified scan elements (302 in FIG. 3) that are allowed on the same sequential position on different scan chains that fan out from the same scan-in pin (307). More specifically, the first position 511a of the first scan chain 511 that receives the test pattern from the first scan-in pin 510 (i.e., position [1][1][1]) is selected (308). A determination is made as to whether or not this first position 511a is empty (310). If the first position 511a is empty, then a determination is made as to whether or not more than C of the identified scan elements are already assigned to any of the other first positions 512a or 513a in any of the other scan chains 512 or 513 that receive the test pattern from that same first scan-in pin 510 (e.g., in positions [1][2 or 3][1]) (312). If the other identified scan elements are not so assigned, then one of the identified scan elements (i.e., latches or flip-flops) that has not already been inserted into the broadcast scan chain structure 500 is inserted into this first position 511a (318). If the first position 511a is not empty (310), if other first positions 512a or 513a are already so assigned (312), or once one of the identified scan elements is inserted into the first position 511a (318), then the next position 511b on this scan chain 511 is selected and evaluated (319).

The process is repeated sequentially through all positions (e.g., positions a- . . . n) in all scan chains (e.g., scan chains 511-513, 521-523, and 531-533) corresponding to all scan-in pins (e.g., 510, 520, and 530) until no empty position is available that does not already have at most C of the identified scan elements from the first cone of logic at the same sequential position in a scan chain that fans out from the same scan-in pin (319-328). For example, as long as there are still scan elements that require insertion, each position in the scan chain is evaluated in sequence. Once a scan chain is completely evaluated, then the first position of the next scan chain that fans out from the first scan-in pin is evaluated, and so on (322). Once all of the positions in all of the scan chains that fan out from the first scan-in pin are evaluated, then the first position of the first scan chain that fans out from the second scan-in pin is evaluated and so on (326).

If any of the identified scan elements (i.e., latches or flip-flops) from the selected cone of logic remain (i.e., still require insertion) after all positions in all scan chains fanning out from all scan-in pins have been evaluated, then C is incremented by one and those remaining identified scan elements are inserted in the same systematic manner, described above, so that no more than C of the scan elements are positioned at the same sequential position in different scan chains that receive the test pattern from the same scan-in pin (330).

For example, if any of the identified scan elements (i.e., latches or flip-flops) from the selected cone of logic remain (i.e., still require insertion) after all positions in all scan chains fanning out from all scan-in pins have been evaluated and two of the selected scan elements are positioned at each sequential position in each set of scan chains fanning out from the same scan-in pin, then those remaining identified scan elements are inserted in the same systematic manner, described above, so that no more than three of the scan elements are positioned at the same sequential position in different scan chains that receive the test pattern from the same scan-in pin. This systematic process continues until all of the identified scan elements (i.e., latches or flip-flops) from the selected cone of logic have been inserted into the broadcast scan structure.

Once all the scan elements (latches or flip-flops) from the selected first cone of logic have been inserted into the scan chains of the broadcast scan structure, a second cone of logic within the circuit is selected. The process of selection of cones of logic for the purpose of inserting the scan elements (latches or flip-flops) from the selected cones of logic into the scan chains of the broadcast scan structure continues until all the cones of logic within the circuit have been selected.

It should be noted that scan elements that provide input to multiple cones of logic are inserted only one time. Thus, it should also be noted that as each cone of logic is considered in series, the determination that is made at process 312 includes an evaluation as to whether any of the scan elements that provided input to the cone of logic currently under consideration also provided input to an earlier considered cone of logic, such that they have already been assigned to a position in one of the scan chains.

Figure 6:
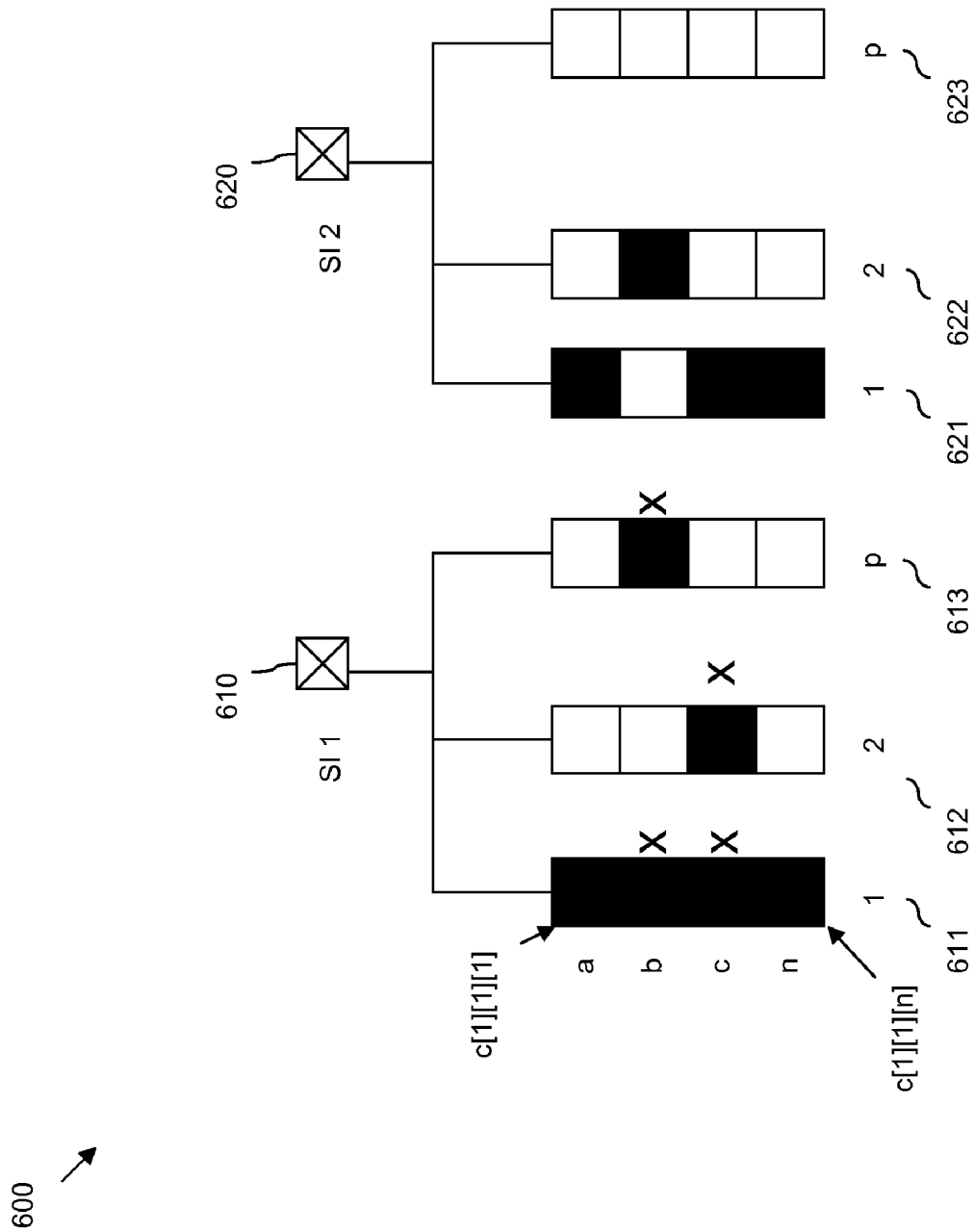
FIG. 6 is a schematic diagram illustrating process 305 of FIG. 3 implemented in an exemplary broadcast scan structure.

FIG. 6 illustrates an exemplary resulting broadcast scan structure 600 following process 330. For example, position 611a is the only first position of scan chains 611-613 that fans out from pin 610 having a scan element from the selected cone of logic and, thus, the first remaining scan element from the selected cone of logic may be inserted into position 612a. Similarly, the next remaining scan element from the selected cone of logic may be inserted into position 612n, since position 611n is the next sequential position of scan chains 611-613 that fans out from pin 610 having a single scan element from the selected cone of logic. Contrarily, positions 611b and 613b of scan chains 611 and 613, respectively, and positions 611c and 612c of scan chains 611 and 612, respectively, each have scan elements inserted from the selected cone of logic and, thus, the next remaining scan element from the selected cone of logic may not be inserted into either of positions 612b or 613c. However, by identifying the scan elements (i.e., latches or flip-flops) that are inputs to the cone of logic that is selected and by systematically inserting these identified scan elements in the manner described above, the likelihood of collisions (i.e., situations in which at least two of the identified scan elements require different input values to test the selected cone of logic) is minimized and test coverage is optimized.

The following exemplary algorithm may be used to implement an embodiment of the method described above.

| | |
|---|---|
| a. | Calculate number L of scan elements in the design. |
| b. | Calculate number m of scan in pins. |
| c. | Calculate broadcast scan fanout factor p. |
| d. | Calculate length of each scan chain n. |
| e. | Let number of scan elements from same logic cone allowed at same sequential position of same scan-in pin be C |
| f. | Let C be 0 to begin |
| g. | Let position of scan elements on scan chains be represented as c[i][j][k], where i=scan-in pin, j=fanout chain from scan in pin i, and k=sequential position on chain j. |
| h. | For every scan element l in the circuit |
| i. | Identify the set S(l) of scan elements that are the inputs of the logic cone feeding scan element l. |
| j. | Let i=j=k=1 /*Begin search at first position in broadcast scan structure*/ |
| k. | For each latch s in S(l) that has not already been inserted in to a scan chain |
| l. | If position c[i][j][k] is empty |
| m. | If not more than C other scan elements belonging to S(1) are already inserted in to any positions c[i][all chains other than j][k]/*Minimum collisions allowed*/ |
| n. | Then assign scan element s to position c[i][j][k] |
| o. | Else go to line 17 |
| p. | Else |
| q. | Increment k=k+1 /*Go down the scan chain to next sequential position*/ |
| r. | If k <= n, go to line 12. /*Try next sequential position in same scan chain*/ |
| s. | Else |
| t. | Increment j=j+1 /*Try next scan chain on same scan-in pin*/ |
| u. | If j <= p |
| v. | Set k=1 /*Begin at first bit position on next scan chain*/ |
| w. | Go to line 12 |
| x. | Else /* All scan chains on current scan-in pin have been tried*/ |
| y. | Increment i=i+1 /*Try next scan-in pin*/ |
| z. | If i <= m |
| aa. | Set j=k=1 /*Begin at first bit position on first scan chain of next scan pin*/ |
| bb. | Go to line 12 |
| cc. | Else /* All scan in pins tried*/ |
| dd. | Increment C=C+1; |
| ee. | Go to Line 8 and repeat procedure. |

Optionally, once the technique, described above, of inserting the identified scan elements into various scan chains is completed, if multiple scan elements (i.e., more than one latch or flip-flop) are inserted at the same sequential position in a scan chains that fan out from the same scan-in pin, these multiple scan elements can be marked (e.g., with an X, as illustrated in FIG. 6) so that they will not be used for test generation (305). By preventing these multiple scan elements from being used for test generation, collisions can be completely eliminated. Thus, the exemplary algorithm set out above can further optionally comprise the following:

If latch s is assigned to a row having a potential collision in line 14

Then mark all scan elements that are inputs to selected cone of logic and which are inserted into same sequential position on different scan chains that fanout from same scan-in pin as X and do not use for test generation /*Therefore collisions are completely eliminated*/

The embodiments of the method of the invention, described above, improve test coverage in a shorter amount of time using broadcast scan testing. Specifically, the method of the invention identifies scan elements with a high degree of bit collisions between them (i.e., scan elements that are inputs to the same cone of logic) and systematically arranges these scan elements either to minimize collisions leading to higher test coverage and improved fault testing or to completely eliminate collisions with potentially reduced test coverage. Furthermore, the method of the invention does not require a priori test generation with broadcast or full scan to calculate collisions.

The embodiments of the invention can take the form of an entirely hardware embodiment, an entirely software embodiment or an embodiment including both hardware and software elements. For example, in one embodiment the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention described above can be practiced with modification within the spirit and scope of the appended claims.

What is claimed is:

1. A method of forming a broadcast scan chain structure having a plurality of scan-in pins, wherein each of said scan-in pins is adapted to insert a test pattern into a corresponding plurality of scan chains, said method comprising:
 selecting a cone of logic;
 identifying all scan elements that provide inputs to said cone of logic; and,
 systematically inserting said scan elements into said scan chains so that insertion of more than one of said scan elements at a same sequential position in different scan chains that receive said test pattern from a same scan-in pin is minimized.

2. The method of claim 1, wherein said scan elements comprise one of latches and flip-flops.

3. The method of claim 1, wherein said process of systematically inserting said scan elements minimizes collisions which result in lower test coverage when at least two of said scan elements require different input values in order to test said cone of logic.

4. The method of claim 1, wherein said cone of logic comprises a combination logic in a circuit that resolves to a single scan element.

5. The method of claim 1, wherein said process of systematically inserting said scan elements further comprises:
selecting a first scan chain that receives said test pattern from a first scan-in pin;
determining if a first position in said first scan chain is empty;
if said first position is empty, determining if any of said scan elements are already assigned to another first position in another scan chain that receives said test pattern from said first scan-in pin; and,
if none of said scan elements are already so assigned, inserting one of said scan elements into said first position.

6. The method of claim 5, wherein said process of systematically inserting said scan elements further comprises:
repeating, as necessary, said selecting and said determining processes sequentially through all positions in all scan chains in said broadcast scan chain structure; and
if any of said scan elements remain after said repeating, continuing said process of systematically inserting said scan elements by adjusting a maximum number of said scan elements that may be positioned at said same sequential position until all of said scan elements have been inserted in said broadcast scan chain structure.

7. A method of forming a broadcast scan chain structure having a plurality of scan-in pins, wherein each of said scan-in pins is adapted to insert a test pattern into to a corresponding plurality of scan chains, said method comprising:
selecting a cone of logic;
identifying all scan elements that provide inputs to said cone of logic;
systematically inserting said scan elements into said scan chains so that insertion of more than one of said scan elements at a same sequential position in different scan chains that receive said test pattern from a same scan-in pin is minimized, and,
if more than one of said scan elements are inserted at said same sequential position, marking said more than one of said scan elements to prohibit use for test generation.

8. The method of claim 7, wherein said scan elements comprise one of latches and flip-flops.

9. The method of claim 7, wherein said process of systematically inserting said scan elements minimizes collisions which result in lower test coverage when at least two of said scan elements require different input values in order to test said cone of logic.

10. The method of claim 7, wherein said cone of logic comprises a combination logic in a circuit that resolves to a single scan element.

11. The method of claim 7, wherein said process of systematically inserting said scan elements further comprises:
selecting a first scan chain that receives said test pattern from a first scan-in pin;
determining if a first position in said first scan chain is empty;
if said first position is empty, determining if any of said scan elements are already assigned to another first position in another scan chain that receives said test pattern from said first scan-in pin; and,
if none of said scan elements are already so assigned, inserting one of said scan elements into said first position.

12. The method of claim 11, wherein said process of systematically inserting said scan elements further comprises:
repeating, as necessary, said selecting and said determining processes sequentially through all positions in all scan chains in said broadcast scan chain structure; and
if any of said scan elements remain after said repeating, continuing said process of systematically inserting said scan elements by adjusting a maximum number of said scan elements that may be positioned at said same sequential position until all of said scan elements have been inserted in said broadcast scan chain structure.

13. A method of forming a broadcast scan chain structure having a plurality of scan-in pins, wherein each of said scan-in pins is adapted to insert a test pattern into to a corresponding plurality of scan chains, said method comprising:
providing a circuit comprising multiple cones of logic, wherein each of said cones of logic receive inputs from a plurality of scan elements and wherein any single scan element may provide input to more than one of said cones of logic;
selecting a cone of logic from said multiple cones of logic;
identifying all of said scan elements that provide inputs to said cone of logic;
systematically inserting said scan elements into said scan chains so that insertion of said scan elements at a same sequential position in different scan chains that receive said test pattern from a same scan-in pin is minimized; and
repeating said processes of selecting, identifying and systematically inserting until every scan element that provides input to said multiple cones of logic is inserted into said broadcast scan chain structure.

14. The method of claim 13, wherein said scan elements comprise one of latches and flip-flops.

15. The method of claim 13, wherein said process of systematically inserting said scan elements minimizes collisions which result in lower test coverage when at least two of said scan elements require different input values in order to test said cone of logic.

16. The method of claim 13, wherein said cone of logic comprises a combination logic in a circuit that resolves to a single scan element.

17. The method of claim 13, wherein said process of systematically inserting said scan elements further comprises:
selecting a first scan chain that receives said test pattern from a first scan-in pin;
determining if a first position in said first scan chain is empty;
if said first position is empty, determining if any of said scan elements are already assigned to another first position in another scan chain that receives said test pattern from said first scan-in pin; and,
if none of said scan elements are already so assigned, inserting one of said scan elements into said first position.

18. The method of claim 17, wherein said process of systematically inserting said scan elements further comprises:
repeating, as necessary, said selecting and said determining processes sequentially through all positions in all scan chains in said broadcast scan chain structure; and
if any of said scan elements remain after said repeating, continuing said process of systematically inserting said scan elements by adjusting a maximum number of said scan elements that may be positioned at said same sequential position until all of said scan elements have been inserted in said broadcast scan chain structure.

19. A method of forming a broadcast scan chain structure having a plurality of scan-in pins, wherein each of said scan-in pins is adapted to insert a test pattern into to a corresponding plurality of scan chains, said method comprising:

providing a circuit comprising multiple cones of logic, wherein each of said cones of logic receive inputs from a plurality of scan elements and wherein any single scan element may provide input to more than one of said cones of logic;

selecting a cone of logic from said multiple cones of logic;

identifying all of said scan elements that provide inputs to said cone of logic;

systematically inserting said scan elements into said scan chains so that insertion of said scan elements at a same sequential position in different scan chains that receive said test pattern from a same scan-in pin is minimized;

if more than one of said scan elements are inserted at said same sequential position, marking said more than one of said scan elements to prohibit use for test generation; and repeating said processes of selecting, identifying, systematically inserting and marking until every scan element that provides an input to said multiple cones of logic in said circuit is inserted into said broadcast scan chain structure.

20. The method of claim 19, wherein said scan elements comprise one of latches and flip-flops.

* * * * *